(12) United States Patent
Inanami et al.

(10) Patent No.: US 6,560,768 B2
(45) Date of Patent: May 6, 2003

(54) CIRCUIT PATTERN DESIGN METHOD, CIRCUIT PATTERN DESIGN SYSTEM, AND RECORDING MEDIUM

(75) Inventors: Ryoichi Inanami, Kawasaki (JP); Shunko Magoshi, Yokohama (JP); Shouhei Kousai, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/878,250

(22) Filed: Jun. 12, 2001

(65) Prior Publication Data

US 2002/0010905 A1 Jan. 24, 2002

(30) Foreign Application Priority Data

Jun. 13, 2000 (JP) .................................. 2000-177309
Mar. 27, 2001 (JP) .................................. 2001-090457

(51) Int. Cl.[7] .............................................. G06F 17/50
(52) U.S. Cl. .......................................... 716/21; 716/19
(58) Field of Search ................ 716/19, 21; 250/492.22; 430/22

(56) References Cited

U.S. PATENT DOCUMENTS 5,682,323 A * 10/1997 Pasch et al. ................. 257/386
5,952,133 A * 9/1999 Nakasuji ....................... 430/22
6,151,101 A * 11/2000 Okino ........................ 250/492.2
6,307,209 B1 * 10/2001 Nakasuji et al. ........ 250/396 R

OTHER PUBLICATIONS

U.S. patent application Ser. No. 09/817,270, R. Inanami, et al., filed Mar. 27, 2001 for "Exposure Pattern Data Generation Apparatus Associated With Standard Cell Library and Charged Beam Exposure".

Inanami, et al., "Throughput Enhancement Strategy of Maskless Electron and Beam Direct Writing for Logic Device," IEDM 2000, Technical Digest (Dec., 2000).

* cited by examiner

Primary Examiner—David Nelms
Assistant Examiner—Tu-Tu Ho
(74) Attorney, Agent, or Firm—Finnegan, Henderson, Farabow, Garrett & Dunner, L.L.P.

(57) ABSTRACT

In a circuit pattern design method which uses a plurality of standard cells that optimize circuit patterns for function units on the basis of a logic description which describes circuit operation of a semiconductor device, and which method generates a circuit pattern corresponding to charged-particle beam exposure using both a character projection exposure method and a variable shaped beam exposure method, the circuit pattern satisfies a design constraint condition, and a predetermined condition imposed on transfer to a sample or imposed on an aperture mask used in exposure by the character projection exposure method.

18 Claims, 10 Drawing Sheets

| Pattern | Width (μm) | Height (μm) | Number of shots | | Reference count | CP efficiency |
|---|---|---|---|---|---|---|
| | | | VSB | CP | | |
| FD1X1 | 8.98 | 4.00 | 47 | 2 | 823 | 18,518 |
| IVX4 | 2.06 | 3.92 | 8 | 1 | 1 | 7 |
| IVX1 | 0.54 | 3.76 | 5 | 1 | 1,508 | 6,032 |

- - - - - - nwell
———— metal1
- - - - active area
━━━━ gate
———— contact

FIG. 9 active area  
FIG. 10A gate  
FIG. 10B contact  
FIG. 10C

CIRCUIT PATTERN DESIGN METHOD, CIRCUIT PATTERN DESIGN SYSTEM, AND RECORDING MEDIUM

CROSS-REFERENCE TO RELATED APPLICATIONS

This application is based upon and claims the benefit of priority from the prior Japanese Patent Applications No. 2000-177309, filed Jun. 13, 2000; and No. 2001-090457, filed Mar. 27, 2001, the entire contents of both of which are incorporated herein by reference.

BACKGROUND OF THE INVENTION

The present invention relates to a circuit pattern design method, circuit pattern design system, and recording medium used for character projection type charged-particle beam exposure.

Electron beam exposure is an effective means for processing the micropattern of a semiconductor circuit. A Variable Shaped Beam (VSB) exposure method as a typical electron beam exposure method divides a circuit pattern into small rectangles or triangles and repetitively exposes them, which increases the number of electron beam shots and decreases the throughput.

To prevent this, a CP (Character Projection) exposure method of shaping an electron beam into the shape of a figure with a size of several micro meter square that can be irradiated with one shot and exposing a figure (character) at once is adopted to decrease the number of shots and increase the throughput.

Figure 12:
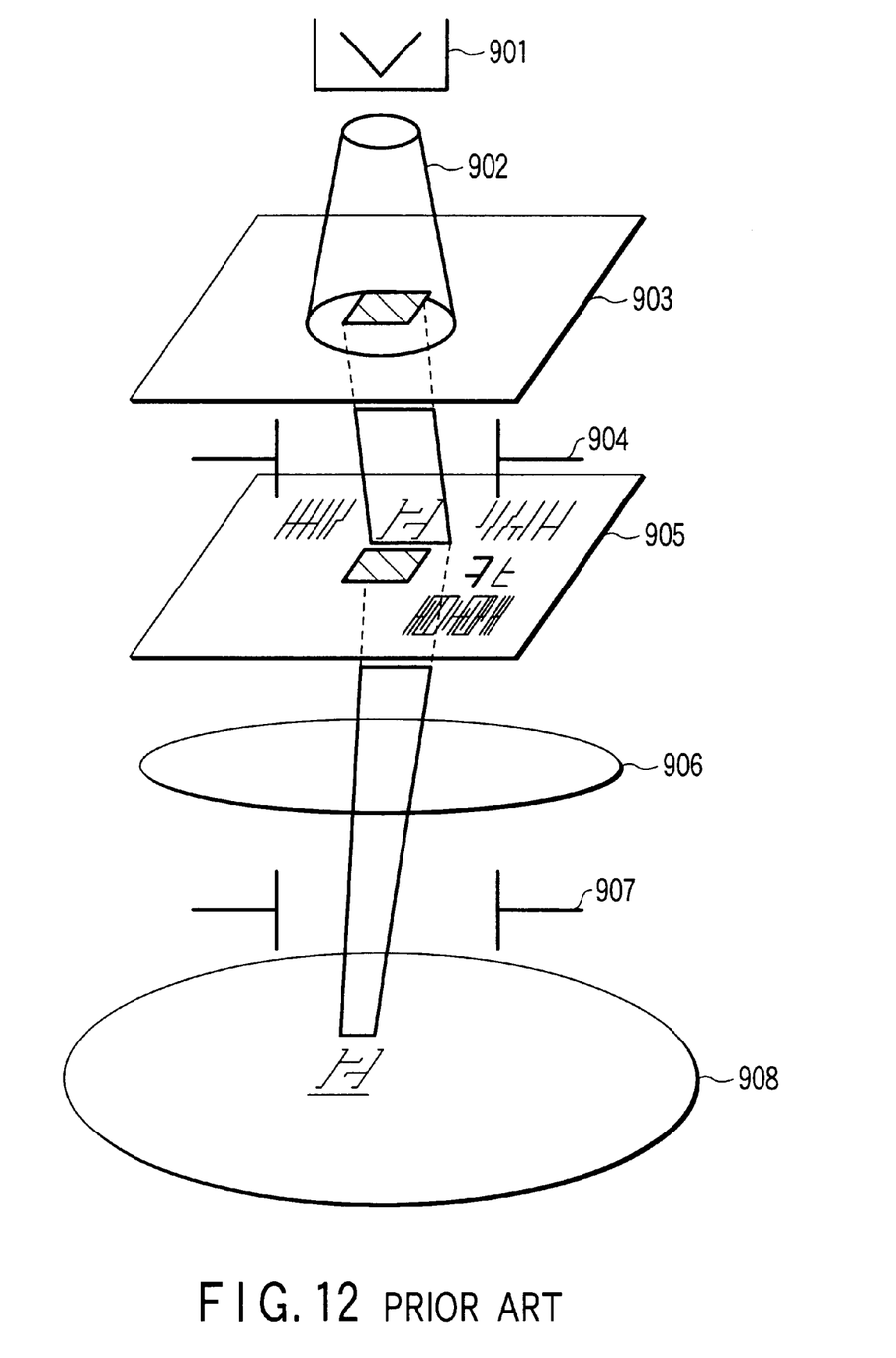
FIG. 12 is a view showing the schematic arrangement of an electron beam exposure apparatus.

FIG. 12 shows the schematic arrangement of an electron beam exposure apparatus. As shown in FIG. 12, an electron beam 902 emitted by an electron gun 901 is shaped into a square by a first shaping aperture 903. The shaped electron beam 902 irradiates via a character selection deflector 904 a character which is a transmission window formed in a CP aperture mask 905. The electron beam 902 having passed through the transmission window with the shape of the character is reduced by a reduction lens 906 and irradiates a desired position on a sample 908 via an objective deflector 907.

The electron beam is shaped by the CP aperture mask having character-shaped apertures. In a general electron beam exposure apparatus, the number of characters which can be arranged within the deflection region of the character selection deflector is about 100 at most.

Figure 13:
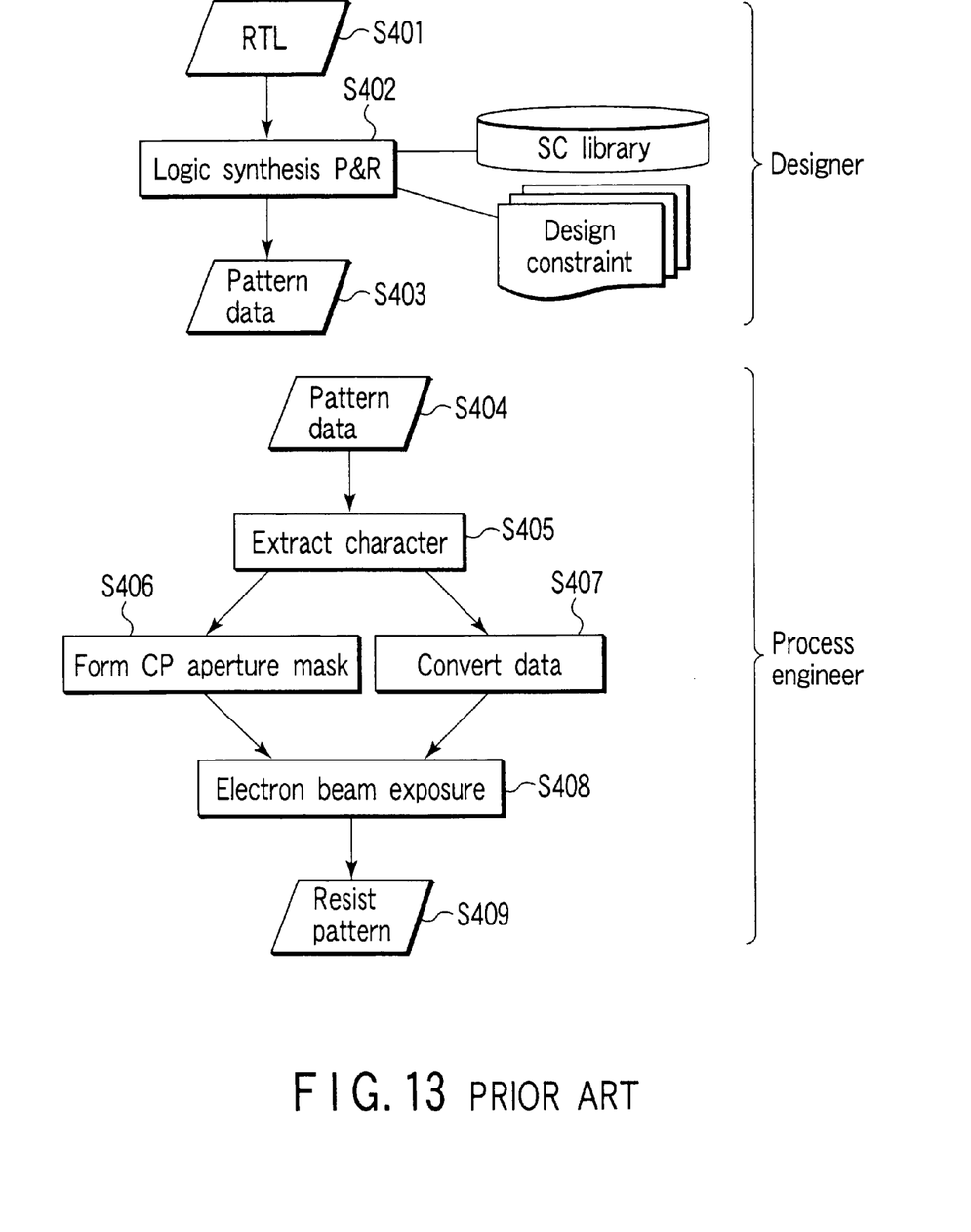
FIG. 13 is a flow chart showing a conventional circuit pattern design method and exposure method.

A method of designing the circuit pattern of a semiconductor product such as an ASIC or system LSI, and a flow up to electron beam exposure will be described with reference to the flow chart of FIG. 13. FIG. 13 is a flow chart showing a conventional circuit pattern design method and exposure method. FIG. 13 shows only steps closely related to this proposition while timing analysis, circuit optimization, and various verifications are omitted.

(Step S401)

The electronic circuit of a semiconductor device is described. This is generally described by using HDL (Hardware Description Language). Among HDL descriptions, an RTL (Register Transfer Level) description which describes the arrangement and operation of a logic circuit between registers is often used.

(Step S402)

Logic synthesis is done based on the described RTL, device characteristics such as an operation frequency, and design constraint conditions such as a chip area. A logic circuit which satisfies the design constraints is generated, and circuit patterns are synthesized based on this logic circuit. The logic circuit is synthesized by assigning functions to standard cells which optimize circuit patterns for functional units such as a logic gate and flip-flop. The patterns of the standard cells are laid out on a chip, and the standard cells are wired each other (Place and Route: P&R).

(Step S403)

Steps S401 and S402 and various verifications are performed, and device pattern data is released in the GDSII STREAM format.

(Step S404)

The process engineer who actually manufactures a device receives the pattern data from the designer.

(Step S405)

Figures which are repetitively used and can serve as characters in CP exposure are extracted from the figures contained in the pattern data. The figures are assigned to characters subjected to CP exposure method by the number of characters which can be set on an exposure apparatus. The remaining figures are exposed by VSB exposure method.

(Step S406)

A CP aperture mask is prepared based on the character information extracted in step S405.

(Step S407)

The pattern data is converted into exposure data which can be input to an electron beam exposure apparatus in use on the basis of the pieces of information in steps S405 and S406.

(Step S408)

The CP aperture mask formed in step S406 is set in the apparatus, the exposure data generated in step S407 is input to the apparatus (or the controller of the exposure apparatus), and electron beam exposure is executed.

(Step S409)

A sample such as a resist film on a Si wafer or mask blanks exposed with an electron beam is extracted from the exposure apparatus, heated, and developed to form a resist pattern.

In this method, a circuit pattern designed by the designer does not consider characters in CP exposure method with electron beam. The process engineer extracts figures serving as CP exposure units from pattern data released by the designer and assigns the figures to characters.

A standard cell library which contains standard cells used in step S402 of FIG. 13 generally includes several hundred types of standard cells. In character extraction of step S405, standard cells serving as the constituting units of logic circuits which constitute a circuit pattern are assigned as characters to be exposed by CP exposure method. As a result, the number of characters necessary for exposing all figures by CP exposure method increases. To prevent this, only some of the figures of the pattern are exposed by CP exposure method, and the remaining figures are exposed by the VSB exposure method of dividing a figure into small rectangles. In a logic device such as an ASIC, the ratio of VSB exposure method is higher than in a device such as a memory including repetitively used figures at high ratio, so even the CP exposure method cannot effectively decrease the number of shots and increase the throughput.

Extensive studies have been made to increase the number of characters laid out on an aperture mask. However, high-precision development is difficult to achieve, and equipment must be installed instead of existing apparatuses, resulting in high cost.

BRIEF SUMMARY OF THE INVENTION (1) There is provided a circuit pattern design method which uses a plurality of standard cells that optimize circuit patterns for function units on the basis of a logic description which describes circuit operation of a semiconductor device, and which method generates a circuit pattern corresponding to charged-particle beam exposure using both a character projection exposure method and a variable shaped beam method, wherein the circuit pattern satisfies a design constraint condition, and a predetermined condition imposed on transfer to a sample or imposed on an aperture mask used in exposure by the character projection exposure method.

(2) According to the present invention, there is provided a charged-particle beam exposure method comprising preparing a circuit pattern design and a character projection (CP) aperture data, the circuit pattern design being prepared using a plurality of standard cells having circuit patterns optimized for function units on the basis of a logic description of circuit operation of a semiconductor device, and corresponding to charged-particle beam exposure using both a character projection exposure method and a variable shaped beam exposure method; and preparing a new CP aperture mask or selecting an appropriate CP aperture mask from existing CP aperture masks on the basis of the CP aperture data; wherein the preparing the circuit pattern design and the CP aperture data includes: generating one or more provisional circuit patterns while gradually decreasing a number of standard cells to be used, determining whether the generated one or more provisional circuit patterns satisfy a design constraint condition, extracting a standard cell used in at least one of said one or more provisional circuit patterns which is determined as satisfying the design constraint condition, in consideration of a layout direction of the standard cell, as a character candidate for exposure by the character projection exposure method, calculating a shot count reduction effect in exposure by the character projection exposure method in comparison with exposure by the variable shaped beam exposure method, setting to form patterns by the character projection exposure method on standard cells sequentially selected in descending order of the shot count reduction effect, and to form patterns by the variable shaped beam exposure method on unselected standard cells, setting unique indices to characters used in formation of standard cells set to form patterns by the character projection exposure method, generating CP aperture data of the indices, a size of each character, and a position of each character on the aperture mask, calculating a number of charged-particle beam shots necessary for forming the at least one provisional circuit pattern determined as satisfying the deign constraint condition In accordance with the set exposure method, and selecting a circuit pattern to be used for exposure from at least one of said one or more provisional circuit patterns which is determined as satisfying the deign constraint condition.

(3) According to the present invention, there is provided a charged-particle beam exposure method comprising preparing a circuit pattern design and a character projection (CP) aperture date, the circuit pattern design being prepared using a plurality of standard cells having circuit patterns optimized for function units on the basis of a logic description of circuit operation of a semiconductor device, and corresponding to charged-particle beam exposure using both a character projection exposure method and a variable shaped beam exposure method; converting the circuit pattern design into date in a format that can be input to a charged-particle beam exposure apparatus by referring to the CP aperture data; wherein the preparing the circuit pattern design and the CP aperture data Includes: generating one or more provisional circuit patterns while gradually decreasing a number of standard cells to be used, determining whether the generated one or more provisional circuit patterns satisfy a design constraint condition, extracting a standard cell used In at least one of said one or more provisional circuit patterns which is determined as satisfying the design constraint condition, in consideration of a layout direction of the standard cell, as a character candidate for exposure by the character projection exposure method, calculating a shot count reduction effect in exposure by the character projection exposure method in comparison with exposure by the variable shaped beam exposure method, setting to form patterns by the character projection exposure method on standard cells sequentially selected in descending order of the shot count reduction effect, and to form patterns by the variable shaped beam exposure method on unselected standard cells, setting unique indices to characters used in formation of standard cells set to form patterns by the character projection exposure method, generating CP aperture data of the indices, a size of each character, and a position of each character on the aperture mask, calculating a number of charged-particle beam shots necessary for forming the at least one provisional circuit pattern determined as satisfying the design constraint condition in accordance with the set exposure method, and selecting a circuit pattern to be used for exposure from at least one of said one or more provisional circuit patterns which is determined as satisfying the design constraint condition.

(4) According to the present invention, there is provided a circuit pattern design system which uses a plurality of standard cells that optimize circuit patterns for function units, and which forms a circuit pattern corresponding to charged-particle beam exposure using both a character projection exposure method and a variable shaped beam exposure method, comprising a standard cell setting unit for setting standard cells used to design the circuit pattern from a standard cell library, a circuit pattern designing unit for generating circuit patterns by using the standard cells set by the standard cell setting unit, a determination unit for determining whether the circuit patterns generated by the circuit pattern designing unit satisfy a design constraint condition, a shot count calculation unit for calculating the number of shots necessary for forming the circuit patterns determined by the determination unit to satisfy the design constraint condition, and a circuit pattern decision unit for deciding as a circuit pattern to be used for exposure a circuit pattern exhibiting the smallest number of charged-particle beam shots among the circuit patterns which satisfy the constraint condition.

(5) There is provided a computer-readable storage medium which stores a program for performing predetermined processing for a plurality of standard cells that optimize circuit patterns for function units on the basis of a logic description describing circuit operation of a semiconductor device, and for generating a circuit pattern corresponding to charged-particle beam exposure using both a character projection exposure method and a variable shaped beam exposure method, wherein the program records a program for implementing the functions of generating circuit patterns while gradually decreasing the number of standard cells to be used, extracting circuit patterns which satisfy a design constraint condition from the generated circuit patterns, calculating the numbers of charged-particle beam shots when the circuit patterns which satisfy the design constraint condition is exposed with a charged-particle beam, and selecting as a circuit pattern to be used for exposure a circuit pattern exhibiting the smallest number of charged-particle beam shots from the circuit patterns which satisfy the design constraint condition.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will be described in detail below with reference to the several views of the accompanying drawing.

[First Embodiment]

In the first embodiment, logic synthesis and P&R (Place and Route) are performed by using the RTL description of a circuit for a given functional block often used in an ASIC or system LSI. The first embodiment concerns a method of generating a pattern which can minimize the number of shots in CP (Character Projection) exposure method with electron beam by decreasing the number of standard cells used in exposure.

Figure 1:
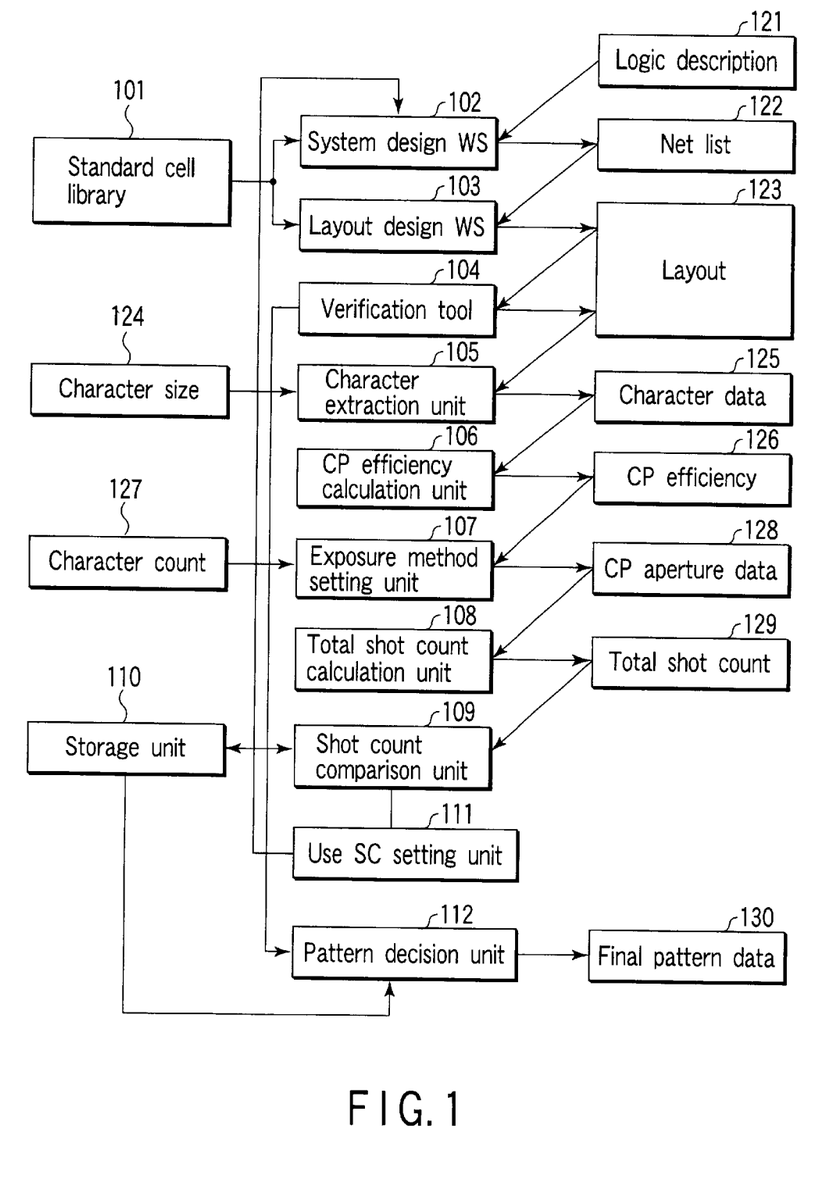
FIG. 1 is a block diagram showing the schematic arrangement of a circuit pattern design system according to the first embodiment.

FIG. 1 is a block diagram showing the schematic arrangement of a circuit pattern design system according to the first embodiment of the present invention.

A circuit pattern design method using this design system will be explained with reference to the flow chart of FIG. 2.

(Step S101)

A logic description 121 which describes the operation of the electronic circuit of a semiconductor device is prepared. In general, a logic description uses HDL (Hardware Description Language). Among HDL descriptions, an RTL (Register Transfer Level) description which describes operation of resisters and logical circuits between resisters.

(Step S102)

A system design WS (Work Station) 102 performs logic synthesis for the logic description 121 by using a standard cell library 101 based on a desired technology, and generates a net list 122 which describes connection information of functional units (cells) that constitute a circuit.

A layout design WS (Work Station) 103 generates a layout (pattern data) 123 by P&R from the generated net list 122.

(Step S103)

A design constraint condition is set, and a verification tool 104 verifies whether the generated layout 123 operates on the logic circuit under the design constraint condition. The condition set at this time is that a generated logic circuit operates at 100 MHz. Since the circuit is verified to operate at 100 MHz, the flow shifts to step S104.

(Step S104)

The number of shots in CP exposure method with electron beam is calculated for the pattern generated in step S103.

The CP effectiveness (to be described later) and the number of shots in actual electron beam exposure must be considered for a pattern after standard cells are laid out on a chip by P&R. Even if standard cells to be used are decided by logic synthesis, subsequent timing analysis, and another processing, the cells are laid out in different directions by vertical reverse, horizontal reverse, or 180° rotation. A current electron beam exposure apparatus cannot irradiate a sample by reversing or rotating an electron beam shaped into a character by using a CP aperture mask. Even if reverse and rotation of a beam can be controlled, the driving force of standard cells to be used may be changed or another standard cell may be inserted as a result of timing verifications and tests performed after P&R. Thus, the number of shots is desirably evaluated after the pattern is determined by performing P&R.

The first embodiment uses an electron beam exposure apparatus capable of setting 100 characters each 5 µm □ in size. That is, standard cells used in the layout 123 generated in step S102 are assigned to characters to be exposed by CP exposure method by up to 100 characters in descending order of shot count reduction effect (to be described later) in comparison with the VSB (Variable Shaped Beam) exposure method. Standard cells not assigned to characters are exposed by VSB exposure method. The gate layer of the pattern is exposed with an electron beam, and the subsequent evaluation is executed for the gate layer of the generated pattern.

Figure 3:
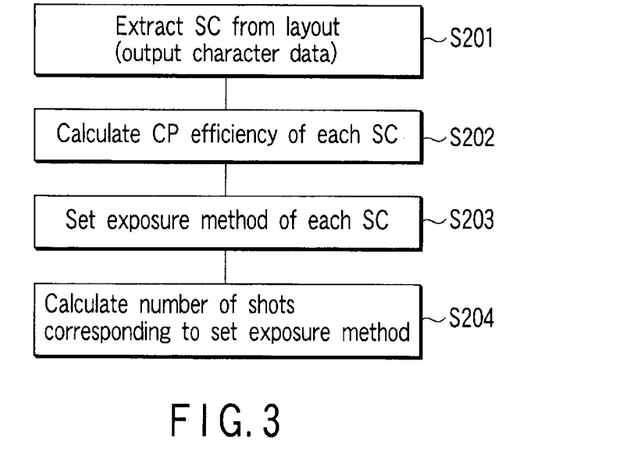
FIG. 3 is a flow chart showing the step of calculating the number of shots.

The step of calculating the number of shots will be explained with reference to the flow chart shown in FIG. 3.

(Step S201)

After a character size 124 is input to a character extraction unit 105, the character extraction unit 105 extracts all the standard cells included in the layout 123, and outputs character data 125 obtained when the standard cells are assigned to characters which can be exposed by CP exposure method.

The pattern data generated by P&R in step S102 is analyzed, and identical standard cells having different layout directions are assigned to different characters to find that 266 characters are required to expose the entire pattern by CP exposure method.

(Step S202)

A CP effectiveness calculation unit 106 calculates a CP effectiveness for each standard cell by referring to the character data 125, and outputs a CP effectiveness 126 for each standard cell. The CP effectiveness exhibits a shot count reduction effect in CP exposure method in comparison with VSB exposure method. This CP effectiveness is given by $$CP\ \text{effectiveness} = \frac{\left[\begin{array}{c}(\text{Number of } VSB \text{ shots}) - \\ (\text{Number of } CP \text{ shots})\end{array}\right]}{(\text{Number of } CP \text{ shots})} \times (\text{Reference count}) \quad (1)$$

In equation (1), the number of VSB shots and that of CP shots are required when target evaluation figures (standard cells) are exposed by VSB exposure method and CP exposure method. The number of shots in CP exposure method is equal to that of characters necessary for forming standard cells, and means the number of characters necessary on a CP aperture mask. For example, a cell larger than a beam size requires a plurality of characters. The reference count is the use count of a character in a generated pattern.

Figure 4:
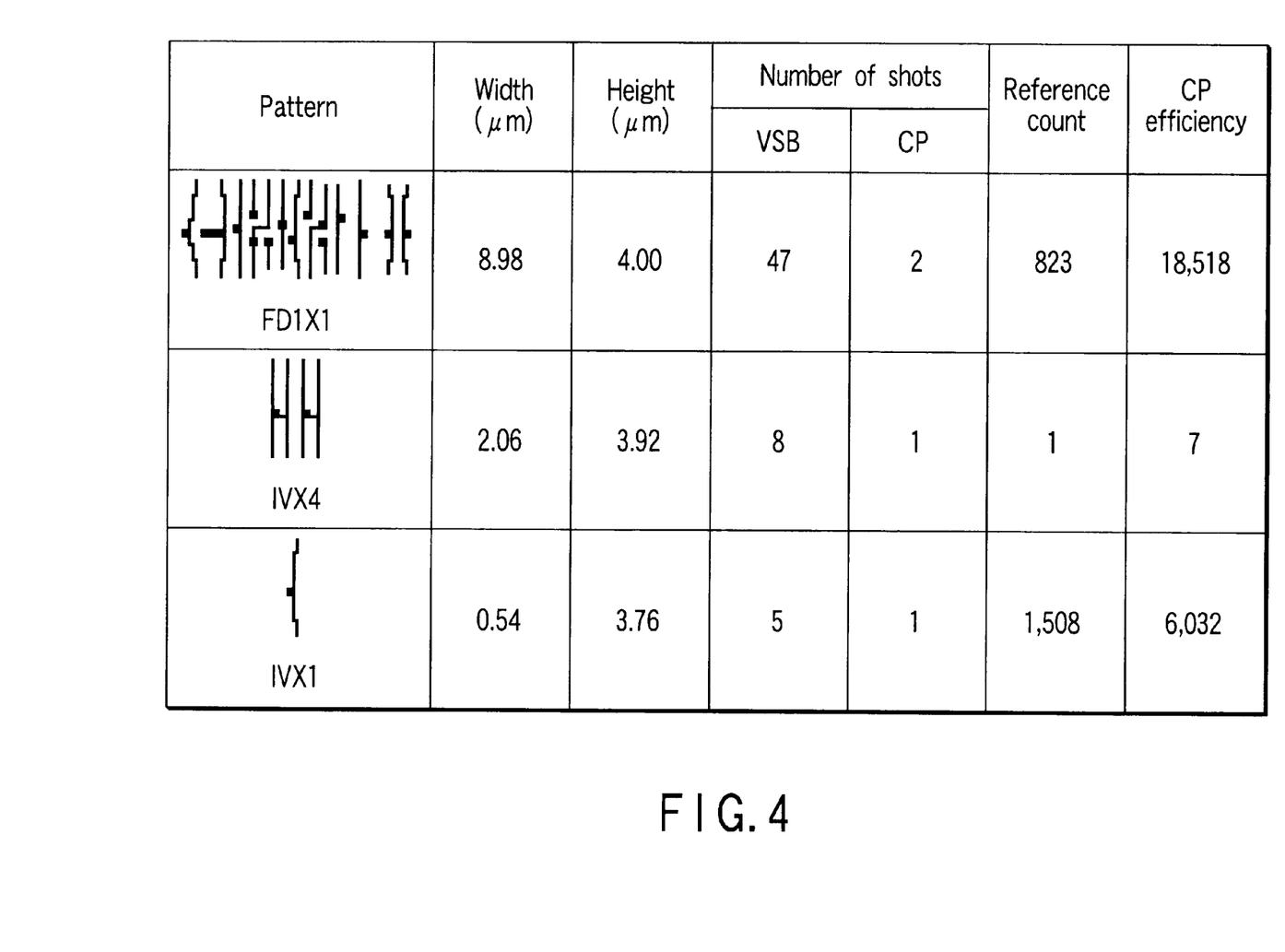
FIG. 4 is a table showing the evaluation result of the CP efficiency for a standard cell used in a logic circuit synthesized by logic synthesis in step S102.

For example, FIG. 4 shows the evaluation results of the CP effectiveness for standard cells used in the logic circuit synthesized by logic synthesis in step S102. The synthesized pattern uses a total of 83 types of standard cells. Among these standard cells, a D flip-flop (FD1X1) exhibits the highest CP effectiveness, and an inverter (IVX4) with a middle driving force exhibits the lowest CP effectiveness. An inverter (IVX1) with the largest reference count and a small driving force has the simplest gate structure, and is a standard cell requiring the smallest number of shots in VSB exposure method. For this reason, even with a large reference count, the CP effectiveness of IVX1 is about ⅓ the highest CP efficiency of FD1X1.

(Step S203)

An exposure method setting unit 107 sets standard cells to be exposed by CP exposure method and standard cells to be exposed by VSB exposure method in accordance with an input character count 127, and outputs the setting results as CP aperture data. Standard cells to be exposed by CP exposure method are selected sequentially from standard cells having higher shot count reduction effects (higher CP efficiencies) by the input character count. Unselected standard cells are set to be exposed by VSB exposure method.

In this case, up to 100 standard cells equal in number to characters settable within a beam deflection region with the CP deflector are set to be exposed by CP exposure method in descending order of CP effectiveness in equation (1), and the remaining standard cells are set to be exposed by VSB exposure method.

Note that the number of set characters is not limited to that of characters settable within a beam deflection region with the CP deflector, and may be larger than that of characters settable within a beam deflection region with the CP deflector.

(Step S204)

A total shot count calculation unit 108 calculates a total electron beam shot count 129 necessary to form the whole pattern in exposure of a circuit pattern on the basis of CP aperture data 128 which records the exposure method of each standard cell.

In the first embodiment, formation of the pattern requires 30,041 shots. Note that this pattern requires 223,448 shots in VSB exposure method.

(Step S105)

Since the shot count "30,041" calculated in step S104 is the shot count of the first generated pattern, a shot count comparison unit 109 determines that this shot count is minimum, and the flow shifts to step S106.

(Step S106)

The shot count comparison unit 109 stores the shot count "30,041" calculated in step S104 as the minimum total shot count, and a corresponding layout in a storage unit 110.

(Step S107)

A use SC (Standard Cell) setting unit 111 eliminates one standard cell used in layout formation by setting the system design WS 102 such that IVX4 having the lowest CP effectiveness among standard cells used in step S102 is not used in subsequent logic synthesis and P&R. At this time, a plurality of standard cells may be reduced, or the system design WS 102 may be set such that standard cells used previous pattern generation (in this case, step S102) except for one or a plurality of standard cells having lower CP effectiveness are used, instead of designating standard cells which are not used.

(Step S102)

After standard cells to be used are reduced in step S107, logic synthesis and P&R are performed again to generate a pattern. In this case, a pattern is generated by using 82 types of standard cells obtained by removing IVX4 determined in step S107 not to be used from the 83 types of standard cells used in previous synthesis. However, the number of types of standard cells used by an actually generated pattern is 74.

(Step S103)

The verification tool 104 verifies the operation of the generated pattern at 100 MHz which is a design constraint condition. Synthesis succeeds, and the flow advances to step S104.

(Step S104)

The number of shots necessary to expose the pattern generated in step S102 in the second cycle is calculated. Similar to the first cycle, the CP effectiveness is newly calculated, the number of characters to be used is limited to 100 or less, standard cells are classified into those which will form a pattern by CP exposure method and those which will form a pattern by VSB exposure method, and then the total shot count is calculated. As a result of calculation, the shot count is 33,610. Note that the number of characters necessary to expose the entire pattern by CP exposure method is 254.

(Step S105)

The shot count comparison unit 109 compares the minimum shot count stored in the storage unit 110 with the shot count calculated in step S104 in the second cycle. Since the calculated shot count "33,610" is larger than the stored minimum shot count "30,041", the flow shifts to step S107 without changing the contents of the storage unit 110.

(Step S107)

A clock buffer NIVX3 exhibits the lowest CP effectiveness among standard cells used in the current pattern, so that the use SC setting unit 111 sets not to use NIVX3 in subsequent pattern synthesis.

Figure 5:
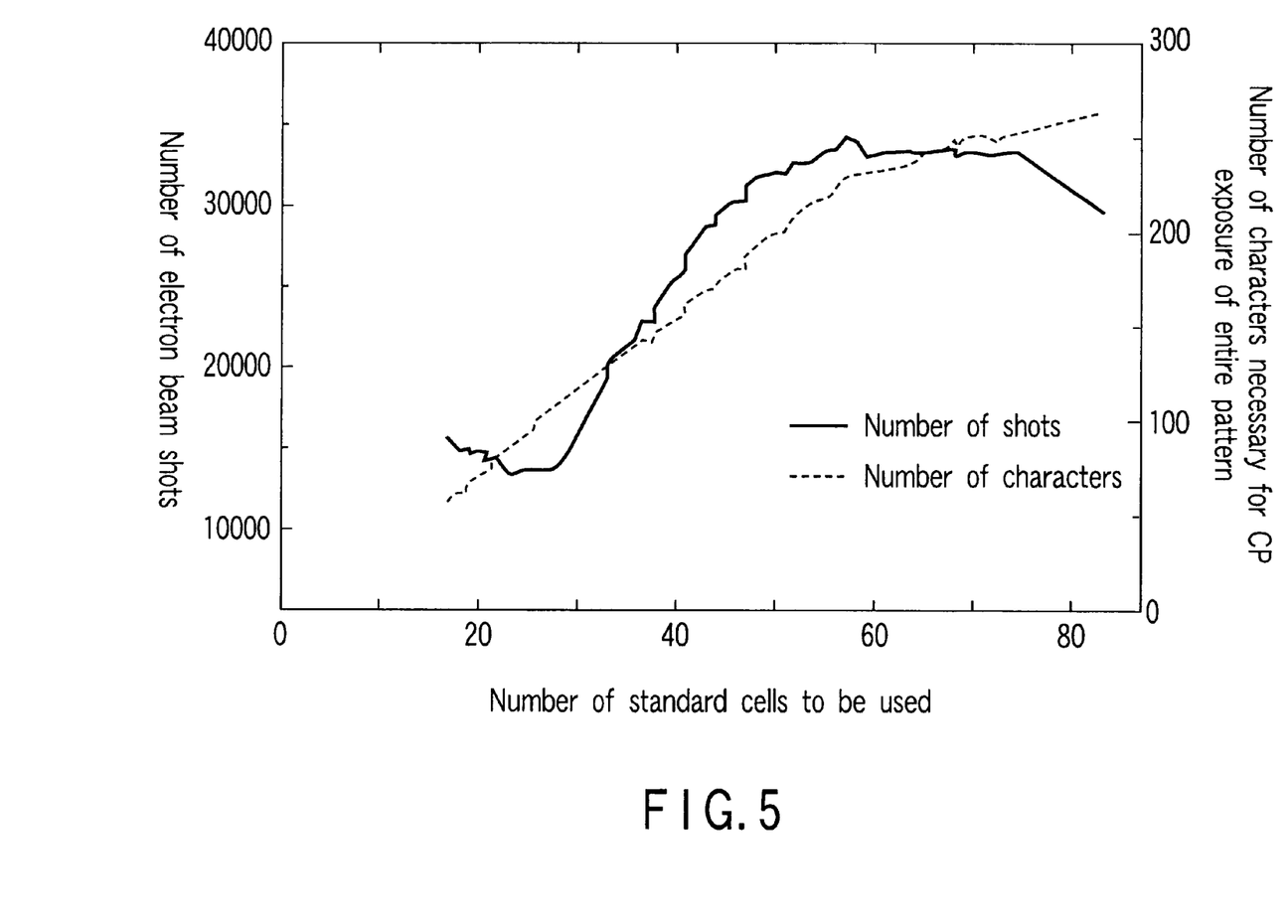
FIG. 5 is a graph showing the number of shots as a function of the number of standard cells used for a synthesized pattern.

After repeating steps S102 to S107 seventy-four times, a circuit which satisfies the constraint condition can no longer be synthesized. FIG. 5 shows the calculated number of shots as a function of the number of standard cells to be used for each of patterns synthesized in the 74 cycles. FIG. 5 also shows the number of characters necessary for exposing each entire pattern by CP exposure method.

(Step S103)

A circuit generated in the 75th cycle cannot operate at 100 MHz which is a design constraint condition in the verification tool 104. Hence, the verification tool 104 informs a pattern decision unit 112 that a circuit pattern which satisfies the design constraint condition has not been formed.

(Step S108)

The pattern decision unit 112 selects as a pattern to be exposed a layout using the minimum number of shots stored in the storage unit 110. In the first embodiment, the shot count "13,656" of a pattern generated in the 61st cycle is minimum. Standard cells used at this time are of 26 types, and the number of characters used in CP exposure method is 99.

(Step S109)

The pattern selected in step S108 is released as a final pattern data 130.

The number of characters necessary to expose the entire first generated pattern by CP exposure method is 266, and the number of shots is 30,041 in the use of both CP exposure method and VSB exposure method. The pattern design method of the first embodiment can reduce the necessary number of characters to 99 and the number of shots to 13,656. The number of shots can be reduced to ½.2 in comparison with the first generated pattern and to ¹⁄16 in comparison with VSB exposure method.

Figure 6:
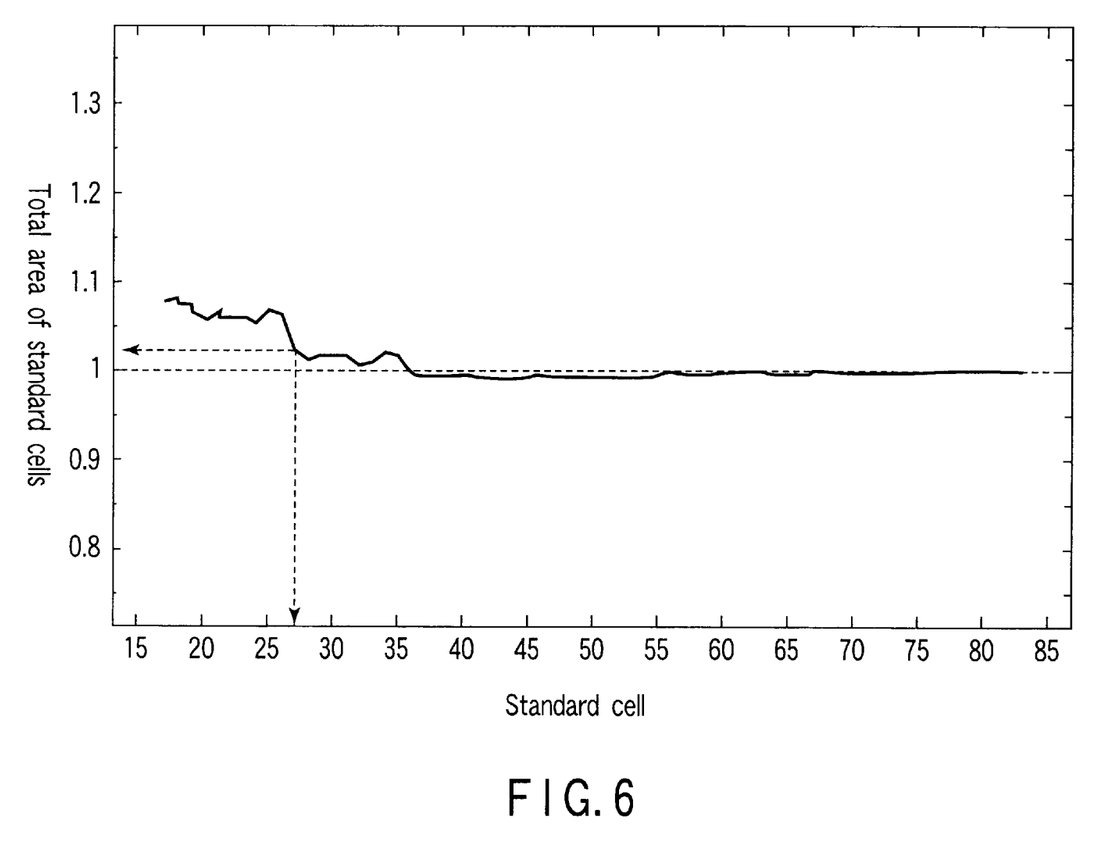
FIG. 6 is a graph showing the relationship between the number of standard cells and the area of a generated circuit pattern.

Although the number of standard cells used to generate a pattern is decreased to 17, an increase in the area of the functional block used in the first embodiment is suppressed to 10% or less. As shown in FIG. 6, even an optimal pattern using the smallest number of shots in CP exposure method with electron beam can suppress an increase in area to only 2% for 26 types of standard cells. FIG. 6 is a graph showing the relationship between the number of standard cells and the area of a generated circuit pattern.

The pattern data design method of the first embodiment can reduce the number of standard cells used to design a pattern and greatly decrease the number of characters necessary to expose the entire circuit pattern by CP exposure method with an electron beam exposure. The number of electron beam shots can be greatly reduced to increase the throughput without greatly increasing the number of character-shaped apertures settable within the deflection region of the character selection deflector of the electron beam exposure apparatus, and without requiring development of an apparatus which can lay out many characters.

[Second Embodiment]

Figure 7:
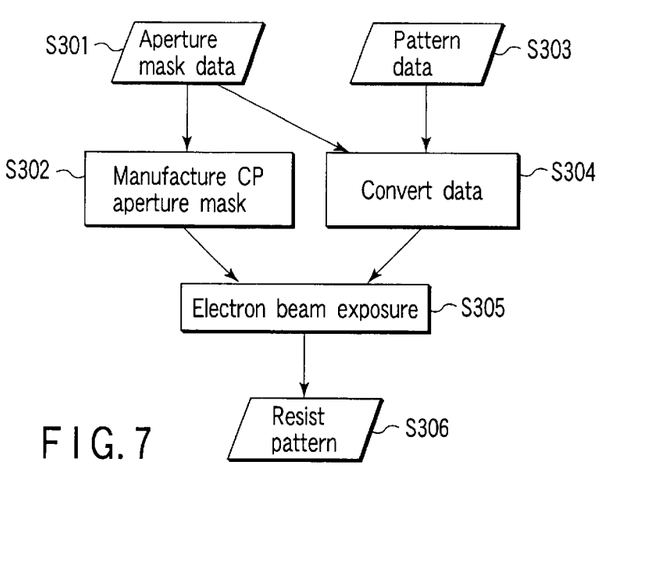
FIG. 7 is a flow chart showing a method of exposing a pattern generated by the circuit pattern design method described in the first embodiment.

In the second embodiment, a method of exposing a pattern generated by the circuit pattern design method described in the first embodiment will be explained with reference to the flow chart of FIG. 7.

In designing a pattern, standard cells assigned to characters used for CP exposure method and standard cells having different layout directions are decided at the release of pattern data, as is known from calculation of the number of shots. Hence, the manufacture of a CP aperture mask can be designated before the process engineer extracts characters.

An exposure method using pattern data generated by the above-described design method will be explained with reference to the flow chart shown in FIG. 7.

(Step S301)

Figures assigned to characters to be exposed by CP exposure method are recorded in CP aperture data 128 during pattern data generation described in the first embodiment. A CP aperture mask is manufactured in accordance with the CP aperture data 128 and CP aperture mask specifications based on this. For standard cells to be exposed by CP exposure method, the CP aperture data contains indices assigned in descending order of CP effectiveness the size of each standard cell layout positions on a CP aperture mask (Step S302)

A CP aperture mask is manufactured based on the CP aperture data prepared in step S301. If a CP aperture mask corresponding to the CP aperture data exists in possessed CP aperture masks, no CP aperture mask need be newly manufactured, and the corresponding CP aperture mask is selected.

(Step S303)

Figure 8:
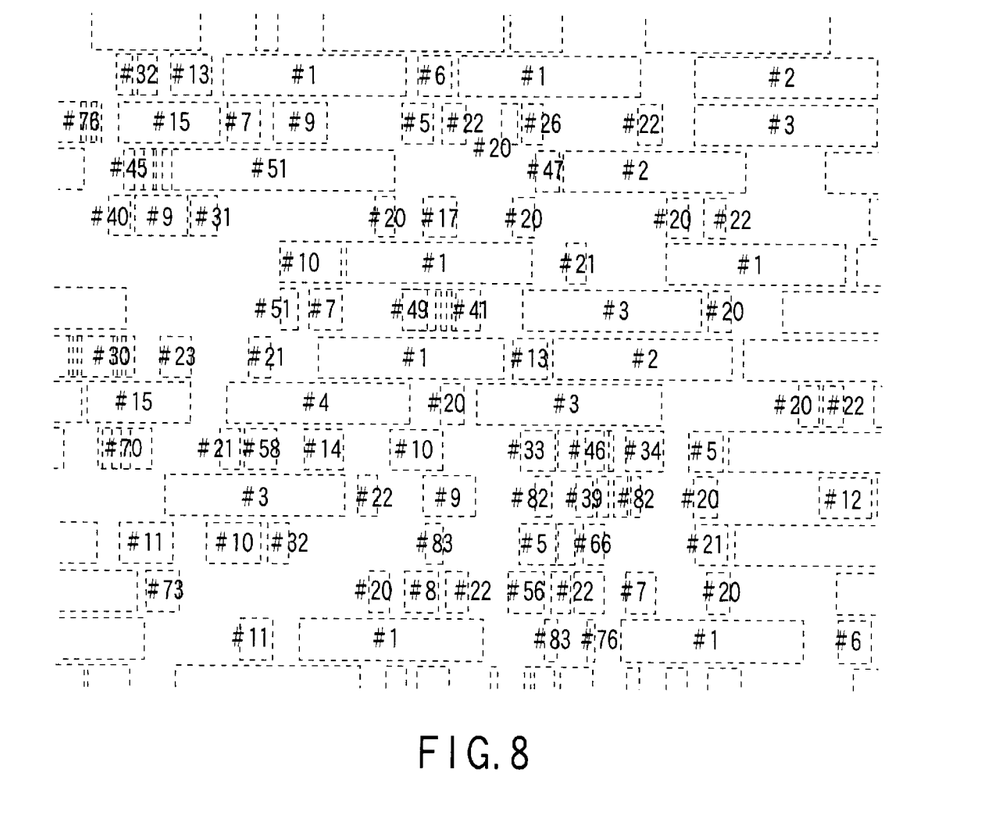
FIG. 8 is a view showing a pattern on which the layout position and size of each standard cell are defined by an index attached to the standard cell according to the second embodiment.

Pattern data 130 generated by the method of the first embodiment is prepared. As shown in FIG. 8, this pattern data defines the layout position and size of each standard cell in accordance with the index attached to the standard cell to be exposed by CP exposure method in step S301. For example, #1 in FIG. 8 represents FD1X1; and #2, a horizontally reversed pattern of FD1X1. FIG. 8 is a view showing a pattern which defines the layout position and size of each standard cell by the index attached to the standard cell according to the second embodiment.

(Step S304)

The pattern data prepared in step S303 are converted into data which can be input to an electron beam exposure apparatus in use. The main operation of data conversion is to make the positions of characters to be sequentially exposed on the CP aperture mask coincide with the irradiation positions of an electron beam on a sample to be exposed. If the sample cannot be exposed to the entire pattern by CP exposure method, a pattern to be exposed by VSB exposure method is divided into small rectangles, and the irradiation order of these rectangles is made to correspond to positions on the sample.

(Step S305)

The CP aperture mask manufactured or selected in step S302 is set in the electron beam exposure apparatus. Characters corresponding to the pattern to be exposed is selected by a character selection deflector. The converted pattern data is input, and electron beam exposure is performed by using it.

(Step S306)

The sample exposed with an electron beam in step S305 is heated and developed to form a resist pattern.

The exposure method of the second embodiment can generate CP aperture data in design, and a CP aperture mask can be manufactured or selected based on the data. Data can be converted by referring to the CP aperture data generated in layout design, and the step of extracting characters to be exposed by CP exposure method from pattern data can be omitted.

The CP aperture data described in the second embodiment can be generated at the same time as pattern data in designing a circuit pattern. Therefore, at the same time as the release of pattern data, a CP aperture mask necessary to form a circuit pattern by CP exposure method with electron beam can be manufactured. By comparing the CP aperture data with CP aperture data which was prepared and has been held, possessed CP aperture masks can be used for exposure without newly manufacturing a CP aperture mask, and an appropriate CP aperture mask can be selected. This enables manufacturing a CP aperture mask early and decreasing the manufacturing cost, compared to the conventional exposure method.

The ratio of patterns which can be exposed by CP exposure method to patterns included in a circuit pattern increases, and the ratio of patterns to be exposed by VSB exposure method decreases. The time taken to divide a pattern into rectangles in data conversion can be shortened. The conventional step of extracting an optimal character can be omitted, the data conversion processing time can be shortened, and the load on a processor (computer) can be reduced.

For characters to be exposed by CP exposure method, only their positions on a chip and their indices are recorded in generated pattern data, and thus the capacity of pattern data becomes smaller than the conventional one. This also enables reducing the load on the processor, and easily uploading/downloading pattern data via a network such as the Internet.

[Third Embodiment]

As a circuit pattern generation method, the first embodiment has described a design method of exposing a gate layer with an electron beam and decreasing the number of shots on the gate layer of the circuit pattern in exposure.

The third embodiment concerns a circuit pattern generation method of minimizing the total number of shots on respective layer patterns when a plurality of layers on a circuit pattern are exposed with an electron beam.

(Arrangement)

Figure 2:
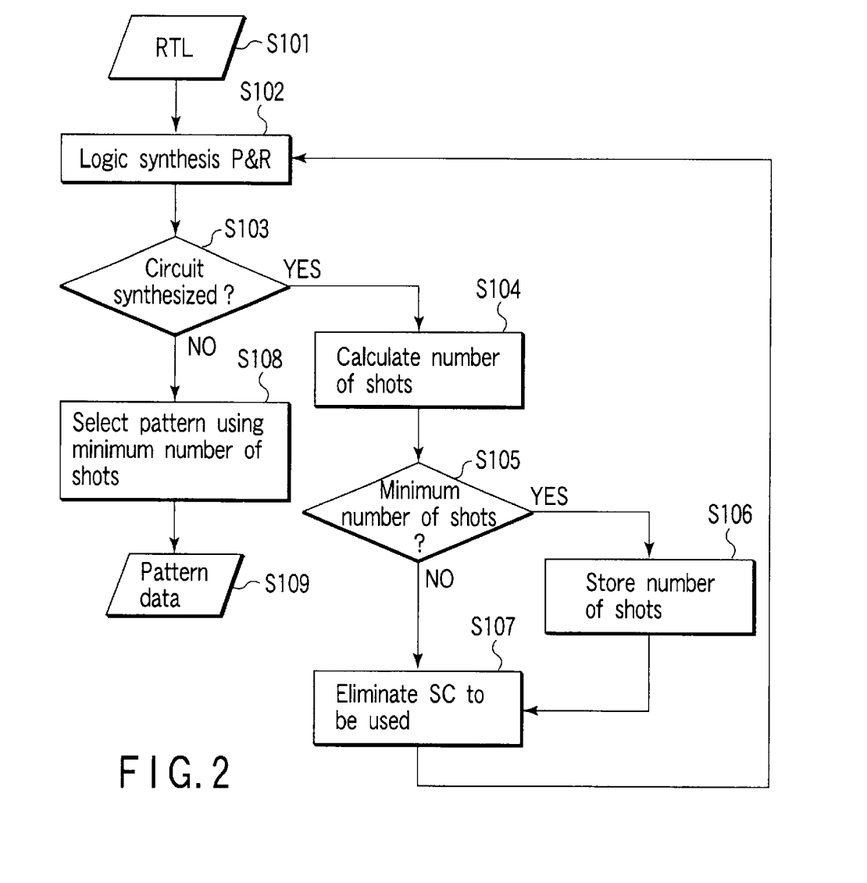
FIG. 2 is a flow chart showing a circuit pattern design method using the design system shown in FIG. 1.

The arrangement of a design system and the circuit pattern generation sequence in the third embodiment are the same as those shown in FIGS. 1 and 2 in the first embodiment. The third embodiment assumes three, gate, AA (Active Area), and contact layers as circuit pattern layers to be exposed with an electron beam.

The pattern generation method of the present invention will be described by exemplifying step S104 in the flow charts of FIGS. 2 and 3, i.e., the CP effectiveness calculation method for each SC (Standard Cell) in step S202 and the shot count calculation method in steps S203 and S204 that reflects the CP effectiveness, and exemplifying the use SC reduction method in step S107.

CP effectiveness corresponding to a plurality of layers are calculated by equation (2) for all the SCs used in a circuit pattern synthesized in step S102:

(CP Effectiveness)

$$=\Sigma(CP \text{ Effectiveness of Respective Layers}) \quad (2)$$

Figure 9:
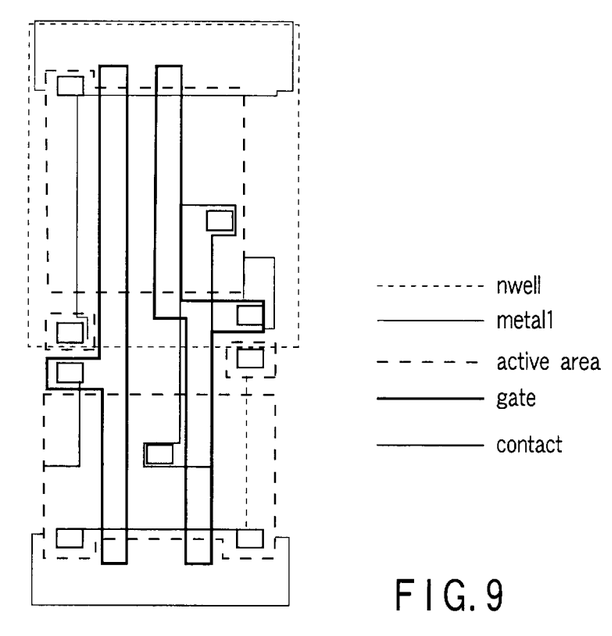
FIG. 9 is a view showing a pattern example of a standard cell which is structured by a 2-input NOR circuit according to the third embodiment.
Figure 10A:
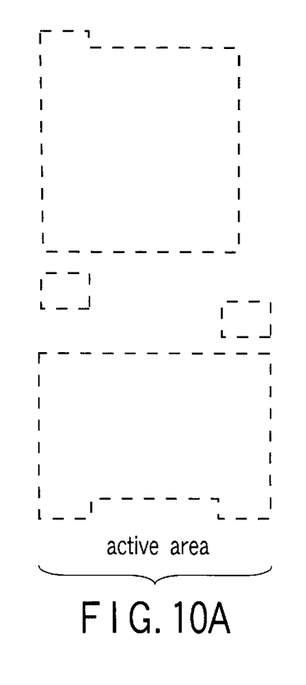
FIG. 10A is a view showing the pattern of an active area layer on the pattern of the 2-input NOR circuit shown in FIG. 9.
Figure 10B:
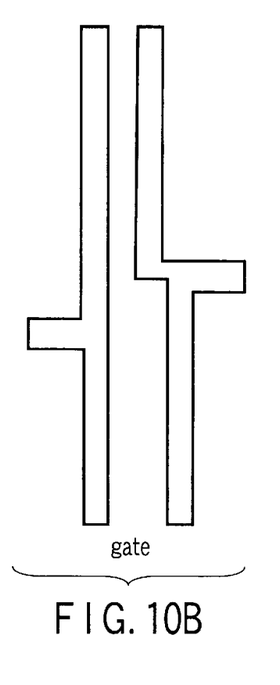
FIG. 10B is a view showing the pattern of a gate layer on the pattern of the 2-input NOR circuit shown in FIG. 9.
Figure 10C:
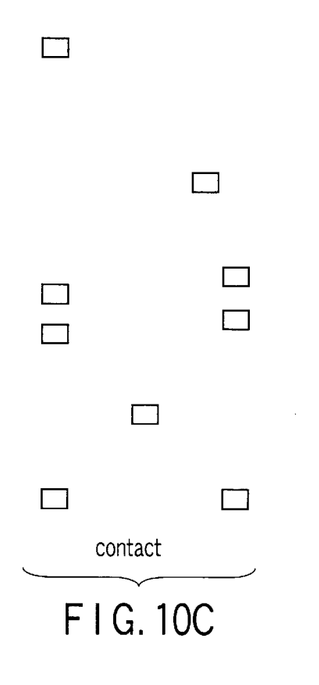
FIG. 10C is a view showing the pattern of a contact layer on the pattern of the 2-input NOR circuit shown in FIG. 9.

For example, CP effectiveness are calculated for the SC of a 2-input NOR circuit pattern as shown in FIG. 9 to obtain the following results. The patterns of AA (Active Area), gate, and contact layers are extracted from the 2-input NOR circuit pattern, as shown in FIGS. 10A to 10C. FIG. 10A shows the pattern of the AA layer, FIG. 10B shows that of the gate layer, and FIG. 10C shows that of the contact layer.

Table 1 shows the outer sizes of these patterns, i.e., the sizes of minimum rectangles circumscribing the patterns, and the numbers of shots necessary for EB exposure of the pattern of each layer by VSB and CP exposure method.

TABLE 1

|  | Gate Layer | AA Layer | Contact Layer |
|---|---|---|---|
| Outer Size ($\mu m^2$) | 1.32 × 400 | 2.82 × 4.17 | 2.20 × 3.80 |
| Number of VSB Shots | 6 | 7 | 9 |
| Number of CP Shots | 1 | 1 | 1 |
| CP Effectiveness (Reference Count = 1) | 5 | 6 | 8 |

The CP effectiveness in table 1 is calculated by equation (1) for one reference count. From table 1, the CP effectiveness of the 2-input NOR circuit is calculated by equation (2) for the patterns of the three, gate, AA, and contact layers to find that the count used in the first generated pattern is 23. Thus, (5+6+8)×23=437 is obtained.

All the SCs used on the pattern generated in step S102 are extracted, and their CP effectiveness are calculated. Character extraction is done in descending order of CP effectiveness until the total number of characters to be exposed by CP exposure method reaches 100. The extracted cells are set to be exposed by CP exposure method, and the remaining cells are set to be exposed by VSB exposure method.

Cases wherein character extraction is done by using the CP effectiveness of each layer and a case wherein character extraction is done by using CP effectiveness corresponding to a plurality of layers that are calculated by equation (2) are compared. The number of shots when character extraction is done by using CP effectiveness corresponding to the patterns of a plurality of layers (in this case, three layers) is defined as 1.0000, and each number of shots is normalized.

TABLE 2

|  | Number of Shots | | | |
|---|---|---|---|---|
| Target CP Effectiveness | Gate Layer | AA Layer | Contact Layer | Total |
| Three Layers | 1.0000 | 1.0000 | 1.0000 | 1.0000 |
| Gate Layer | 0.9916 | 0.9976 | 1.0486 | 1.0172 |
| AA Layer | 1.0393 | 0.9955 | 1.0498 | 1.0317 |
| Contact Layer | 1.0218 | 1.0018 | 0.9921 | 1.0046 |

Table 2 shows that the total number of shots necessary for exposing the patterns of the three layers is smaller in character extraction using the CP effectiveness of the three layers than in character extraction using the CP effectiveness of only one layer. For example, the number of shots on an entire wafer is 100,000,000 in character extraction using the CP effectiveness of the three layers, whereas the number of shots is larger by 460,000 to 3,170,000 shots as a whole in character extraction using the CP effectiveness of only one layer.

In the step of deciding an SC to be eliminated when pattern generation is repeated while reducing the number of SCs to be used, an SC exhibiting the smallest CP effectiveness for the patterns of a plurality of layers is eliminated.

Figure 11:
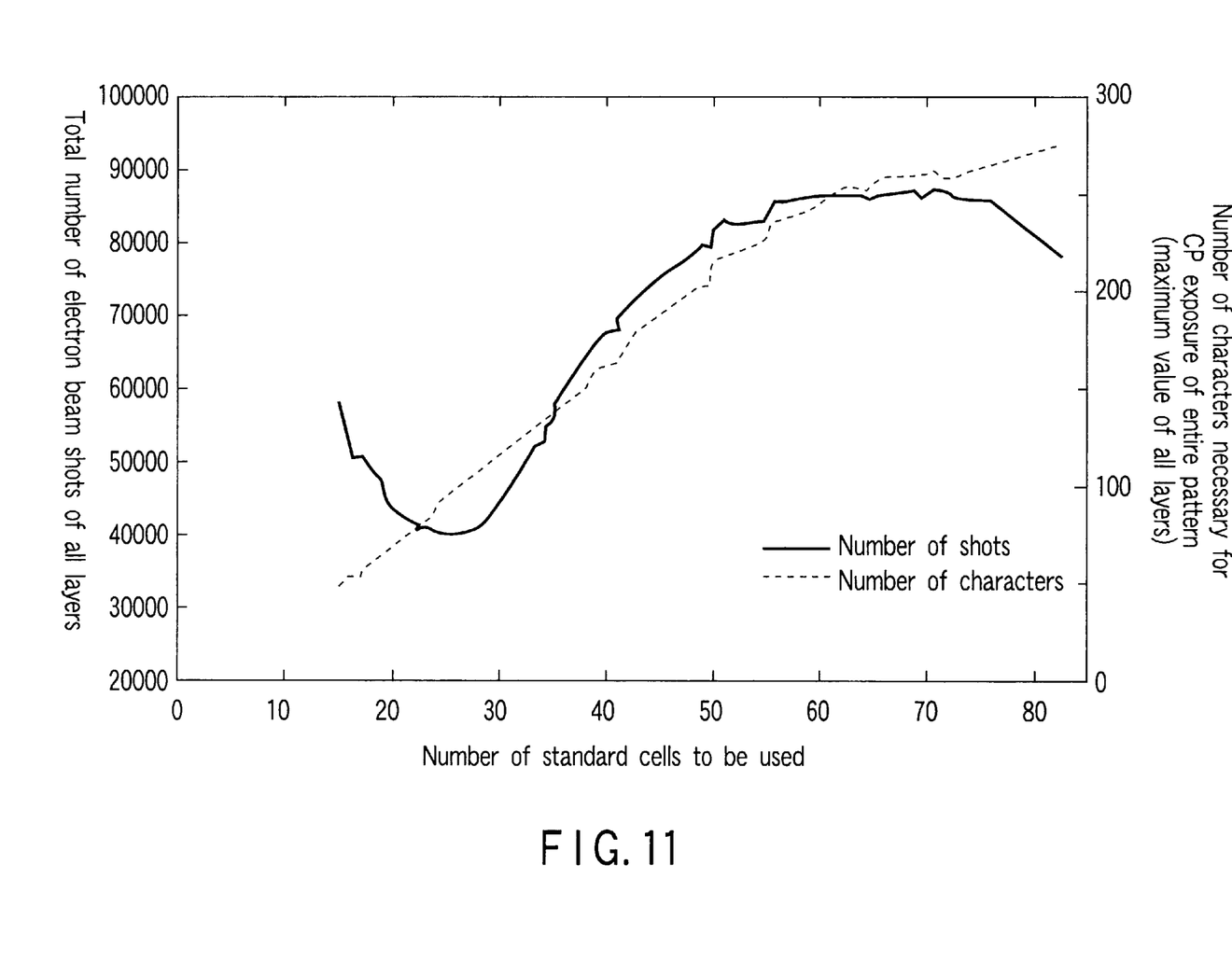
FIG. 11 is a graph showing the relationship between the numbers of cells, characters, and shots when CP effectiveness corresponding to a plurality of layers are used.

FIG. 11 shows the relationship between the number of characters and that of shots on each generated pattern when pattern generation is repeated while the number of SCs to be used is reduced. It can be confirmed that the same characteristics as those in FIG. 5 considering only a gate layer are obtained.

CP effectiveness corresponding to a plurality of layers in the third embodiment can be used to generate patterns which can be exposed with an electron beam by the smallest total number of shots in exposing the patterns of three, gate, AA, and contact layers.

(Effects)

By using CP effectiveness corresponding to a plurality of layers in the third embodiment, the total number of shots in exposing the patterns of layers can be minimized for the patterns of a plurality of layers to be exposed with an electron beam. A sample can be properly exposed by CP exposure method with an electron beam to a pattern generated by the semiconductor device circuit pattern design method proposed by the present invention. The time taken to manufacture a device can be shortened, and the productivity in the production of semiconductor devices using electron beam exposure can be increased.

The present invention is not limited to the above embodiments. For example, the present invention can also be applied to charged-particle beam exposure using an ion beam or the like, other than electron beam exposure.

A circuit pattern using the smallest number of shots is finally released. The present invention is not limited to this, and may release a circuit pattern on which the number of characters is equal to or smaller than the number of characters which can be laid out in a region that can be irradiated with an electron beam without mechanically moving an aperture mask.

The present invention can be variously modified without departing from the spirit and scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A circuit pattern design method which uses a plurality of standard cells having circuit patterns optimized for function units on the basis of a logic description which describes circuit operation of a semiconductor device, and which forms a circuit pattern corresponding to charged-particle beam exposure using both a character projection exposure method and a variable shaped beam exposure method, the method comprising:

generating one or more provisional circuit patterns while gradually decreasing a number of standard cells to be used;

determining whether the generated one or more provisional circuit patterns satisfy a design constraint condition;

calculating a number of charged-particle beam shots when at least one of said one or more provisional circuit patterns which satisfies the design constraint condition is exposed with a charged-particle beam; and selecting a circuit pattern to be used for exposure from the at least one provisional circuit pattern determined as satisfying the design constraint condition.

2. The circuit pattern design method according to claim 1, wherein generation of the circuit pattern which satisfies the design constraint condition and the predetermined condition includes the steps of generating at least one provisional circuit pattern while gradually decreasing the number of standard cells to be used, determining whether the generated provisional circuit pattern satisfies the design constraint condition, calculating the number of charged-particle beam shots when the provisional circuit pattern which satisfies the design constraint condition is exposed with a charged-particle beam, and selecting as a circuit pattern to be used for exposure a circuit pattern exhibiting the smallest number of charged-particle beam shots from provisional circuit patterns determined to satisfy the design constraint condition.

3. The circuit pattern design method according to claim 1, wherein the step of calculating the number of charged-particle beam shots includes:

a step of extracting a standard cell used in the at least one provisional circuit pattern determined as satisfying the design constraint condition, in consideration of a layout direction of the standard cell, as a character candidate for exposure by the character projection exposure method, a step of calculating a shot count reduction effect in exposure by the character projection exposure method in comparison with exposure by the variable shaped beam exposure method, an exposure method setting step of setting to form patterns by the character projection exposure method on standard cells sequentially selected in descending order of shot count reduction effect, and to form patterns by the variable shaped beam exposure method on unselected standard cells, and a step of calculating a number of charged-particle beam shots necessary for forming the at least one provisional circuit pattern determined as satisfying the design constraint condition in accordance with the set exposure method.

4. The circuit pattern design method according to claim 3, wherein the total number of characters necessary for forming the standard cells set to form patterns by exposure using the character projection exposure method is not more than the number of characters which can be laid out in a region that can be irradiated with the charged-particle beam without moving the aperture mask of a charged-particle beam exposure apparatus.

5. The circuit pattern design method according to claim 3, wherein at least one standard cell selected in ascending order of shot count reduction effect is set as a standard cell not to be used in the step of following generation of at least one provisional circuit pattern while gradually decreasing the number of standard cells to be used.

6. The circuit pattern design method according to claim 3, wherein in the exposure method setting step, unique indices are set to characters used to form standard cells for the standard cells set to form patterns by the character projection exposure method, and CP aperture data which records the indices, a size of each character, and a position of each character on the aperture mask is generated.

7. The circuit pattern design method according to claim 3, wherein the shot count reduction effect of each standard cell is calculated for one circuit pattern layer on which a pattern is formed by charged-particle beam exposure among circuit pattern layers necessary for forming the semiconductor device.

8. The circuit pattern design method according to claim 3, wherein the shot count reduction effect of each standard cell is a sum of shot count reduction effects calculated for a plurality of circuit pattern layers on which patterns are formed by charged-particle beam exposure among circuit pattern layers necessary for forming the semiconductor device.

9. The circuit pattern design method according to claim 1, wherein the circuit pattern to be used for exposure exhibits a smallest number of charged-particle beam shots among the at least one provisional circuit pattern determined as satisfying the design constraint condition.

10. A charged-particle beam exposure method comprising:
preparing a circuit pattern design and a character projection (CP) aperture data, the circuit pattern design being prepared using a plurality of standard cells having circuit patterns optimized for function units on the basis of a logic description of circuit operation of a semiconductor device, and corresponding to charged-particle beam exposure using both a character projection exposure method and a variable shaped beam exposure method; and
preparing a new CP aperture mask or selecting an appropriate CP aperture mask from existing CP aperture masks on the basis of the CP aperture data;
wherein the preparing the circuit pattern design and the CP aperture data includes:
generating one or more provisional circuit patterns while gradually decreasing a number of standard cells to be used,
determining whether the generated one or more provisional circuit patterns satisfy a design constraint condition,
extracting a standard cell used in at least one of said one or more provisional circuit patterns which is determined as satisfying the design constraint condition, in consideration of a layout direction of the standard cell, as a character candidate for exposure by the character projection exposure method,
calculating a shot count reduction effect in exposure by the character projection exposure method in comparison with exposure by the variable shaped beam exposure method,
setting to form patterns by the character projection exposure method on standard cells sequentially selected in descending order of the shot count reduction effect, and to form patterns by the variable shaped beam exposure method on unselected standard cells,
setting unique indices to characters used in formation of standard cells set to form patterns by the character projection exposure method,
generating CP aperture data of the indices, a size of each character, and a position of each character on the aperture mask,
calculating a number of charged-particle beam shots necessary for forming the at least one provisional circuit pattern determined as satisfying the design constraint condition in accordance with the set exposure method, and
selecting a circuit pattern to be used for exposure from at least one of said one or more provisional circuit patterns which is determined as satisfying the design constraint condition.

11. A charged-particle beam exposure method according to claim 10, wherein the circuit pattern to be used for exposure exhibits a smallest number of charged-particle beam shots among the at least one provisional circuit pattern determined as satisfying the design constraint condition.

12. A charged-particle beam exposure method comprising:
preparing a circuit pattern design and a character projection (CP) aperture data, the circuit pattern design being prepared using a plurality of standard cells having circuit patterns optimized for function units on the basis of a logic description of circuit operation of a semiconductor device, and corresponding to charged-particle beam exposure using both a character projection exposure method and a variable shaped beam exposure method;
converting the circuit pattern design into data in a format that can be input to a charged-particle beam exposure apparatus by referring to the CP aperture data:
wherein the preparing the circuit pattern design and the CP aperture data includes,
generating one or more provisional circuit patterns while gradually decreasing a number of standard cells to be used,
determining whether the generated one or more provisional circuit patterns satisfy a design constraint condition,
extracting a standard cell used in at least one of said one or more provisional circuit patterns which is determined as satisfying the design constraint condition, in consideration of a layout direction of the standard cell, as a character candidate for exposure by the character projection exposure method,
calculating a shot count reduction effect in exposure by the character projection exposure method in comparison with exposure by the variable shaped beam exposure method,
setting to form patterns by the character projection exposure method on standard cells sequentially selected in descending order of the shot count reduction effect, and to form patterns by the variable shaped beam exposure method on unselected standard cells,
setting unique indices to characters used in formation of standard cells set to form patterns by the character projection exposure method,
generating CP aperture data of the indices, a size of each character, and a position of each character on the aperture mask,
calculating a number of charged-particle beam shots necessary for forming the at least one provisional circuit pattern determined as satisfying the design constraint condition in accordance with the set exposure method, and
selecting a circuit pattern to be used for exposure from at least one of said one or more provisional circuit patterns which is determined as satisfying the design constraint condition.

13. A charged-particle beam exposure method according to claim 12, wherein the circuit pattern to be used for exposure exhibits a smallest number of charged-particle beam shots among the at least one provisional circuit pattern determined as satisfying the design constraint condition.

14. A circuit pattern design system which uses a plurality of standard cells that optimize circuit patterns for function units, and which forms a circuit pattern corresponding to charged-particle beam exposure using both a character projection exposure method and a variable shaped beam exposure method, comprising:
a circuit pattern designing unit configured to generate circuit patterns while gradually decreasing a number of standard cells to be used;

a determination unit configured to determine whether the circuit patterns generated by said circuit pattern designing unit satisfy a design constraint condition;

a shot count calculation unit configured to calculate the number of shots necessary for forming at least one of the circuit patterns which is determined by said determination unit as satisfying the design constraint condition; and a circuit pattern decision unit configured to decide a circuit pattern to be used for exposure from the at least one circuit pattern which satisfies the constraint condition.

15. The circuit pattern design system according to claim 14, wherein the circuit pattern decision unit decides a circuit pattern that exhibits a smallest number of charged-particle beam shots among the at least one circuit pattern which satisfies the constraint condition as the circuit pattern to be used for exposure.

16. A computer-readable storage medium which stores a program for performing predetermined processing for a plurality of standard cells that optimize circuit patterns for function units on the basis of a logic description describing circuit operation of a semiconductor device, and for generating a circuit pattern corresponding to charged-particle beam exposure using both a character projection exposure method and a variable shaped beam exposure method, wherein the program records a program for implementing the functions of generating circuit patterns while gradually decreasing the number of standard cells to be used, extracting circuit patterns which satisfy a design constraint condition from the generated circuit patterns, calculating a number of charged-particle beam shots when the circuit patterns which satisfy the design constraint condition is exposed with a charged-particle beam, and selecting as a circuit pattern to be used for exposure, a circuit pattern that exhibits a smallest number of charged-particle beam shots from the circuit patterns which satisfy the design constraint condition.

17. A computer-readable storage medium which stores a program for performing predetermined processing for a plurality of standard cells that optimize circuit patterns for function units on the basis of a logic description describing circuit operation of a semiconductor device, and for generating a circuit pattern corresponding to charged-particle beam exposure using both a character projection exposure method and a variable shaped beam exposure method, wherein the program records a program for implementing the functions of generating circuit patterns while gradually decreasing the number of standard cells to be used, extracting circuit patterns which satisfy a design constraint condition from the generated circuit patterns, calculating a number of charged-particle beam shots when the circuit patterns which satisfy the design constraint condition is exposed with a charged-particle beam, and selecting a circuit pattern to be used for exposure from the circuit patterns which satisfy the design constraint condition.

18. The computer-readable storage medium according to claim 17, wherein the circuit pattern to be used for exposure exhibits a smallest number of charged-particle beam shots among the circuit patterns which satisfy the design constraint condition.

* * * * *